(12) United States Patent
Ricci et al.

(10) Patent No.: US 8,410,393 B2
(45) Date of Patent: Apr. 2, 2013

(54) APPARATUS AND METHOD FOR TEMPERATURE CONTROL OF A SEMICONDUCTOR SUBSTRATE SUPPORT

(75) Inventors: Anthony Ricci, Sunnyvale, CA (US); Saurabh Ullal, Union City, CA (US); Michael Kang, San Ramon, CA (US); Matthew Busche, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 388 days.

(21) Appl. No.: 12/785,774

(22) Filed: May 24, 2010

(65) Prior Publication Data
US 2011/0284505 A1    Nov. 24, 2011

(51) Int. Cl.
*B23K 37/00* (2006.01)

(52) U.S. Cl. .............. 219/121.54; 219/121.59; 118/715; 118/728

(58) Field of Classification Search .............. 219/121.54; 118/715, 728
See application file for complete search history.

(56) References Cited

U.S. PATENT DOCUMENTS

| | | | |
|---|---|---|---|
| 5,567,267 A | 10/1996 | Kazama et al. | |
| 5,579,826 A | 12/1996 | Hamilton et al. | |
| 5,645,683 A | 7/1997 | Miyamoto | |
| 5,846,375 A * | 12/1998 | Gilchrist et al. | 156/345.52 |
| 6,026,896 A | 2/2000 | Hunter | |
| 6,032,724 A | 3/2000 | Hatta | |
| 6,117,245 A * | 9/2000 | Mandrekar et al. | 118/724 |
| 6,148,626 A | 11/2000 | Iwamoto | |

(Continued)

FOREIGN PATENT DOCUMENTS

| | | |
|---|---|---|
| JP | 62001017 A | 1/1987 |
| JP | 3291469 A | 12/1991 |

(Continued)

OTHER PUBLICATIONS

The Swagelok Company, "One-Piece Instrumentation Ball Valves", Instrumentation Ball Valves—40G Series and 40 Series, www.swagelok.com, pp. 1-27, Jun. 2009.

(Continued)

*Primary Examiner* — Wai Sing Louie
*Assistant Examiner* — William Harriston
(74) *Attorney, Agent, or Firm* — Buchanan Ingersoll & Rooney PC

(57) ABSTRACT

A recirculation system of a substrate support on which a semiconductor substrate is subjected to a multistep process in a vacuum chamber, the system comprising a substrate support having at least one liquid flow passage in a base plate thereof, an inlet and an outlet in fluid communication with the flow passage, a supply line in fluid communication with the inlet, and a return line in fluid communication with the outlet; a first recirculator providing liquid at temperature $T_1$ in fluid communication with the supply line and the return line; a second recirculator providing liquid at temperature $T_2$ in fluid communication with the supply line and the return line, temperature $T_2$ being at least 10° C. above temperature $T_1$; a pre-cooling unit providing liquid at temperature $T_{pc}$ connected to the inlet and the outlet, temperature $T_{pc}$ being at least 10° C. below $T_1$; a pre-heating unit providing liquid at temperature $T_{ph}$ connected to the inlet and the outlet, temperature $T_{ph}$ being at least 10° C. above $T_2$; a controller operable to selectively operate valves of the recirculation system to recirculate liquid between the flow passage and the first recirculator, the second recirculator, the pre-cooling unit or the pre-heating unit.

24 Claims, 14 Drawing Sheets

U.S. PATENT DOCUMENTS

| | | |
|---|---|---|
| 6,247,531 B1 | 6/2001 | Cowans |
| 6,269,871 B1 | 8/2001 | Nishio et al. |
| 6,308,776 B1 | 10/2001 | Sloan et al. |
| 6,331,697 B2 | 12/2001 | Savas |
| 6,433,314 B1 * | 8/2002 | Mandrekar et al. .......... 219/390 |
| 6,461,801 B1 | 10/2002 | Wang |
| 6,700,099 B2 | 3/2004 | Cole, Sr. et al. |
| 6,705,095 B2 | 3/2004 | Thompson, Jr. et al. |
| 6,770,852 B1 | 8/2004 | Steger |
| 6,774,046 B2 | 8/2004 | DeOrnellas et al. |
| 6,822,202 B2 | 11/2004 | Atlas |
| 6,847,014 B1 | 1/2005 | Benjamin et al. |
| 6,866,094 B2 | 3/2005 | Cousineau et al. |
| 6,992,892 B2 | 1/2006 | Moroz et al. |
| 6,993,919 B2 | 2/2006 | Hirooka et al. |
| 7,000,416 B2 | 2/2006 | Hirooka et al. |
| 7,017,652 B2 | 3/2006 | Mitrovic et al. |
| 7,178,346 B2 | 2/2007 | Huang et al. |
| 7,180,036 B2 | 2/2007 | Atlas |
| 7,216,496 B2 | 5/2007 | Yamazaki |
| 7,221,553 B2 | 5/2007 | Nguyen et al. |
| 7,225,864 B2 | 6/2007 | Jeong |
| 7,274,004 B2 | 9/2007 | Benjamin et al. |
| 7,297,894 B1 | 11/2007 | Tsukamoto |
| 7,396,711 B2 | 7/2008 | Shah et al. |
| 7,557,328 B2 | 7/2009 | Ohata |
| 7,637,114 B2 | 12/2009 | Choi et al. |
| 7,993,460 B2 | 8/2011 | Steger |
| 2002/0020189 A1 | 2/2002 | Namose |
| 2003/0052118 A1 | 3/2003 | Ramanan et al. |
| 2004/0068997 A1 | 4/2004 | Hirooka et al. |
| 2004/0187787 A1 | 9/2004 | Dawson et al. |
| 2004/0216425 A1 | 11/2004 | Morton et al. |
| 2004/0216475 A1 | 11/2004 | Sasaki et al. |
| 2004/0261721 A1 * | 12/2004 | Steger .......................... 118/728 |
| 2004/0261946 A1 | 12/2004 | Endoh et al. |
| 2005/0133157 A1 | 6/2005 | Choi |
| 2006/0027169 A1 | 2/2006 | Tsukamoto et al. |
| 2006/0201172 A1 | 9/2006 | Kaneko et al. |
| 2006/0219360 A1 | 10/2006 | Iwasaki |
| 2007/0081296 A1 | 4/2007 | Brillhart et al. |
| 2007/0235134 A1 | 10/2007 | Iimuro |
| 2008/0035306 A1 | 2/2008 | White et al. |
| 2008/0170969 A1 | 7/2008 | Yoshioka et al. |
| 2009/0071938 A1 | 3/2009 | Dhindsa et al. |
| 2009/0107956 A1 | 4/2009 | Sievers et al. |
| 2009/0215201 A1 | 8/2009 | Benjamin et al. |
| 2012/0098405 A1 * | 4/2012 | Chen et al. ............... 313/231.31 |

FOREIGN PATENT DOCUMENTS

| | | |
|---|---|---|
| JP | 5133662 A | 5/1993 |
| JP | 06-117722 | 4/1994 |
| JP | 2003294322 A | 10/2003 |
| JP | 2008251681 A | 10/2008 |
| KR | 10-0722935 B1 | 5/2007 |
| WO | WO2005/007928 A1 | 1/2005 |

OTHER PUBLICATIONS

International Search Report and Written Opinion mailed Feb. 10, 2012 for PCT/US2011/000867.

* cited by examiner

APPARATUS AND METHOD FOR TEMPERATURE CONTROL OF A SEMICONDUCTOR SUBSTRATE SUPPORT

BACKGROUND

With each successive semiconductor technology generation, wafer diameters tend to increase and transistor sizes decrease, resulting in the need for an ever higher degree of accuracy and repeatability in wafer processing. Semiconductor substrate materials, such as silicon wafers, are processed by techniques which include the use of vacuum chambers. These techniques include non plasma applications such as electron beam evaporation, as well as plasma applications, such as sputter deposition, plasma-enhanced chemical vapor deposition (PECVD), resist strip, and plasma etch.

Success metrics for a plasma processing system include throughput and substrate temperature stability. Substrate temperature affects critical dimensions of devices fabricated on a substrate and thus must not significantly drift when stable substrate temperature is required, e.g. within a step in a processing recipe. On the other hand, optimum substrate temperature can be significantly different for different process steps within a process recipe. The rate of change in substrate temperature directly impacts the throughput. Therefore, a capability of quickly changing substrate temperature between process steps while maintaining stable substrate temperature within a process step is desirable. Electrically-based heating approaches are complicated by the need for compatibility with radio frequency energy used in a plasma processing system, requiring custom filtering to protect power and control systems for electrical heaters. Design and implementation challenges also exist regarding power connections. In addition, challenges involving heater layout to optimize thermal uniformity can be significant.

SUMMARY

A recirculation system of a substrate support on which a semiconductor substrate is subjected to a multistep process in a vacuum chamber, the system comprising: a substrate support having at least one liquid flow passage in a base plate thereof, an inlet and an outlet in fluid communication with the flow passage, a supply line in fluid communication with the inlet, and a return line in fluid communication with the outlet; a first recirculator providing liquid at temperature $T_1$ to the supply line and the return line, the first recirculator being in fluid communication with the supply line and the return line; a second recirculator providing liquid at temperature $T_2$ to the supply line and the return line, the second recirculator in fluid communication with the supply line and the return line, temperature $T_2$ being at least 10° C. above temperature $T_1$; a pre-cooling unit providing liquid at temperature $T_{pc}$ to the supply line and the return line, temperature $T_{pc}$ being at least 10° C. below $T_1$; a pre-heating unit providing liquid at temperature $T_{ph}$ to the supply line and the return line, temperature $T_{ph}$ being at least 10° C. above $T_2$; a controller operable to selectively operate valves of the recirculation system to direct liquids at $T_1$, $T_2$, $T_{pc}$ or $T_{ph}$ provided by the first recirculator, the second recirculator, the pre-cooling unit or the pre-heating unit through the supply line and the return line.

A method of operating a recirculation system of a substrate support on which a semiconductor substrate is subjected to a multistep process in a vacuum chamber, the method comprising: circulating liquid in a substrate support having at least one liquid flow passage in a base plate thereof, an inlet and an outlet in fluid communication with the flow passage, a supply line in fluid communication with the inlet, and a return line in fluid communication with the outlet, wherein the method includes: supplying liquid at temperature $T_1$ to the flow passage, the liquid at temperature $T_1$ being supplied by a first recirculator in fluid communication with the supply line and the return line; supplying liquid at temperature $T_2$ to the flow passage, the liquid at temperature $T_2$ being supplied by a second recirculator in fluid communication with the supply line and the return line, temperature $T_2$ being at least 10° C. above temperature $T_1$; supplying liquid at temperature $T_{pc}$ to the flow passage, temperature $T_{pc}$ being at least 10° C. below $T_1$; supplying liquid at temperature $T_{ph}$ to the flow passage, temperature $T_{ph}$ being at least 10° C. above $T_2$; the liquid at temperature $T_{pc}$ being supplied immediately prior to supplying the liquid at temperature $T_1$; the liquid at temperature $T_{ph}$ being supplied immediately prior to supplying the liquid at temperature $T_2$.

DETAILED DESCRIPTION

Disclosed herein is a recirculation system which can rapidly change substrate temperature in a plasma processing system by circulating a temperature controlled liquid (e.g. Fluorinert™ dielectric fluid) through one or more flow passages embedded in a substrate support, on which a substrate is processed in a plasma chamber. The flow passage(s) can be arranged to provide single or multiple zone temperature control, e.g. the flow passage can effect temperature control of an entire substrate support surface of the substrate support or a single zone (thermal zone) such as a center zone or outer annular zone of the substrate support surface of the substrate support 100. Preferably, temperature of the substrate is controlled solely by the liquid circulating in the flow passage(s), i.e. the substrate support preferably does not have an electrical heater so as to avoid issues associated therewith, such as coupling of radio-frequency (RF) power control circuitry of the electrical heater. The substrate support preferably includes an arrangement to supply a heat transfer gas such as helium under the substrate to improve thermal conduction between the substrate and the substrate support and the substrate support can be a grounded or powered electrode supplied radiofrequency current (RF) to provide an RF bias on the substrate or generate plasma in the chamber.

Figure 1:
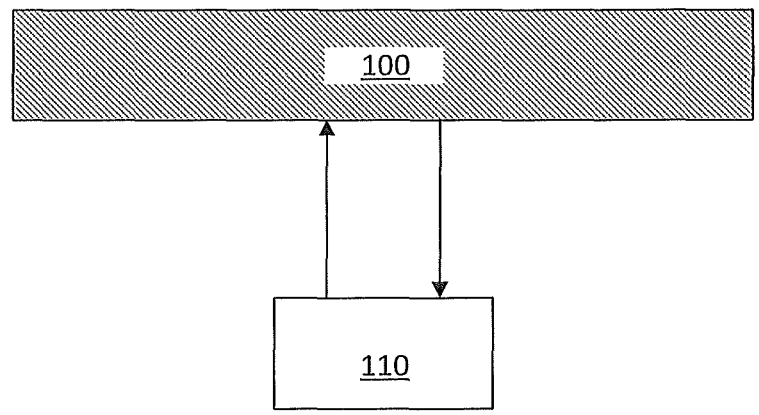
FIG. 1 shows a diagram of a prior art temperature control system.

FIG. 1 shows a prior art system wherein the liquid is circulated between the substrate support 100 and a temperature control unit such as a recirculator 110 with a large fluid reservoir maintained at a constant temperature. A typical flow rate from the recirculator 110 is about 4 gallons/minute. Large thermal capacitance of the large fluid reservoir renders this approach very effective in maintaining a stable fluid temperature, but is undesirably slow in changing the fluid temperature during a multistep process wherein rapid changes in substrate temperatures are desired such as during plasma etching.

Figure 2:
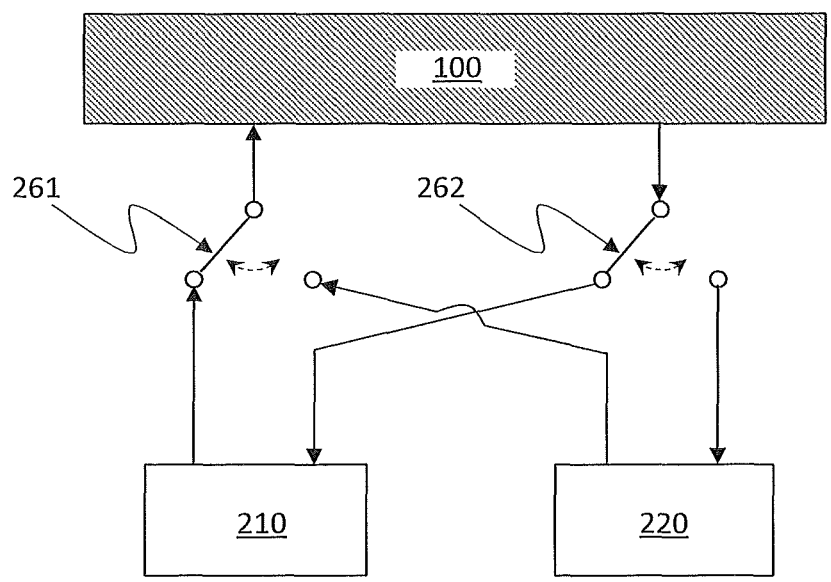
FIG. 2 shows a diagram of another prior art temperature control system.

As shown in FIG. 2, a conventional approach to maintain two different substrate temperatures during two different process steps and switching therebetween includes connecting two temperature control units, such as recirculators 210 and 220 to the substrate support 100. Each of the recirculators maintains a large fluid (liquid) reservoir at a temperature required in one of the process steps. Two valves 261 and 262 are configured to cooperatively switch the fluid flowing through the substrate support 100 between the two recirculators 210 and 220. Difference in fluid levels in the recirculators 210 and 220 can occur over time and equalization thereof can become necessary.

For a plasma processing system wherein a temperature gradient within the substrate support is small and response of the substrate support to heat transfer is quite uniform, the substrate support can be described using the lumped thermal capacity model. In this model, the substrate support can be described as a thermal capacitance and thermal resistance in parallel connected to a temperature source, which can be the fluid circulating through the substrate support. The temperature of the substrate support ($T_{sub}$) is given by a differential equation:

$$\frac{dT_{sub}}{dt} = -\frac{(T_{sub} - T_0)}{RC} \quad \text{(Eq. 1)}$$

wherein t is time; C is the thermal capacity of the substrate support; R is the thermal resistance between the temperature source (e.g. the circulating fluid) and the substrate support; $T_0$ is the temperature of the temperature controlled fluid source. The thermal resistance R=1/hA, wherein h is the heat transfer coefficient and A is the heat transfer surface area, between the temperature source and the substrate support. The thermal capacity of the substrate support C=ρcV, wherein ρ is the density, c is the specific heat and V is the volume, of the substrate support.

Figure 3:
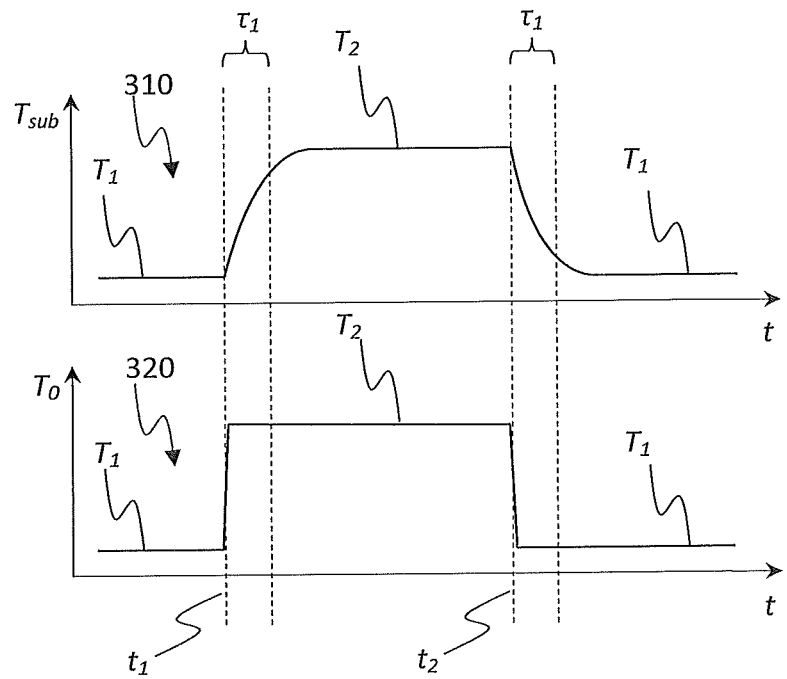
FIG. 3 is a graph of temperature versus time for the substrate support and the temperature control system shown in FIG. 2.

FIG. 2 shows a prior art system with two (e.g., cold and hot) recirculators and FIG. 3 shows representational temperature profiles of the substrate support and liquid circulating in the substrate support. However, FIG. 3 does not take into account plasma heating of the wafer, e.g., during plasma etching the wafer may be 50 to 80° C. hotter than the substrate support temperature. A trace 320 shows the fluid temperature $T_0$ flowing in the substrate support 100 as a function of time; a trace 310 shows $T_{sub}$ as a function of time in response to the fluid temperature. Prior to time $t_1$, the valves 261 and 262 direct fluid from the cold recirculator 210 through the substrate support 100. The recirculator 210 maintains a reservoir temperature at $T_1$. At time $t_1$, the valves 261 and 262 cut off fluid flow from the recirculator 210 and direct fluid at temperature $T_2$ from the hot recirculator 220 through the substrate support 100. The recirculator 220 maintains a reservoir temperature $T_2$ which is higher than $T_1$. At time $t_2$, the valves 261 and 262 cut off fluid flow from the recirculator 220 and again direct fluid from the recirculator 210 through the substrate support 100. $T_1$ is a substrate support temperature required by a process step before time $t_1$ and after time $t_2$. $T_2$ is a substrate support temperature required by a process step between times $t_1$ and $t_2$.

For simplicity, $T_{sub}$ before time $t_1$ is assumed to be $T_1$. $T_{sub}$ as a function of time is deduced from Eq. 1 and plotted as the trace 310. Upon abrupt switching of the fluid between the recirculators 210 and 220 at times $t_1$ and $t_2$, $T_{sub}$ shows an exponential change, with a time constant $\tau_1$=RC. The time constant $\tau_1$ is a measure of how fast $T_{sub}$ changes in response to an abrupt fluid temperature change. The time constant $\tau_1$ affects the throughput of the plasma processing system, because substrate support temperature must be stabilized before a process step can begin. The effect of the time constant $\tau_1$ on the throughput becomes pronounced as the time constant $\tau_1$ becomes comparable with a typical time duration of a process step. Therefore, it is desirable to minimize the time constant $\tau_1$.

Figure 4:
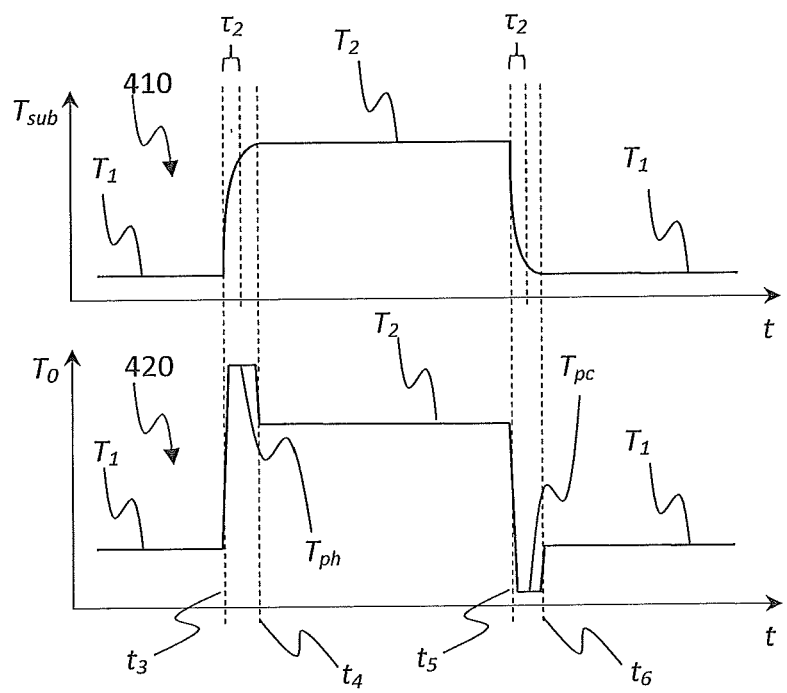
FIG. 4 is a graph of temperature versus time for a substrate support and a temperature control system according to embodiments described herein.

The recirculation system and the method of using the recirculation system as described herein decrease the time constants by accelerating heat transfer to or from the substrate support 100 by transiently flowing fluids above or below the required substrate support temperatures through the substrate support 100. A trace 420 in FIG. 4 shows the fluid temperature flowing in the substrate support 100 as a function of time wherein a trace 410 shows $T_{sub}$ as a function of time. Before time $t_3$, a first fluid at temperature $T_1$ is flowed through the substrate support 100. At time $t_3$, the first fluid is cut off and a pre-heated fluid at temperature $T_{ph}$ is flowed through the substrate support 100, wherein $T_{ph}$ is higher than $T_2$. At time $t_4$ when $T_{sub}$ is within a predefined tolerance to $T_2$ (e.g. within 2° C., preferably within 1° C., more preferably within 0.5° C.), the pre-heated fluid is cut off and a second fluid at temperature $T_2$ is flowed through the substrate support 100. Similarly, at time $t_5$, the second fluid is cut off and a pre-cooled fluid at temperature $T_{pc}$ is flowed through the substrate support 100, wherein $T_{pc}$ is lower than $T_1$. At time $t_6$ when the temperature of the substrate 100 is within a predefined tolerance to $T_1$ (e.g. within 2° C., preferably within 1° C., more preferably within 0.5° C.), the pre-cooled fluid is cut off and the first fluid is again flowed through the substrate support 100. $T_1$ is a substrate support temperature required by a process step before time $t_3$ and after time $t_6$. $T_2$ is a substrate support temperature required by a process step between times $t_4$ and $t_5$. One advantage of the recirculation system and the method of using the recirculation system is that $T_{sub}$ reaches a target substrate support temperatures faster without significant overshooting.

For simplicity, $T_{sub}$ before time $t_3$ is assumed to be $T_1$. $T_{sub}$ as a function of time is deduced from Eq. 1 and plotted as the trace 410. Similar to the trace 310 in FIG. 3, $T_{sub}$ shows an exponential change after times $t_3$ and $t_5$, with a time constant $\tau_2$ wherein $\tau_2$ is less than $\tau_1$. This shortened time constant increases throughput in the plasma processing system. $T_{ph}$ is preferably higher than $T_2$ by at least 10° C., more preferably at least 30° C. is preferably lower than $T_1$ by at least 10° C., more preferably at least 30° C. The difference between $t_4$ and $t_3$ ($\Delta t_{ph}$) is a fraction of a time period between $t_4$ and $t_5$ ($\Delta t_h$). For example, $\Delta t_h$ can be from 50 to 200 seconds, and $\Delta t_{ph}$ can be up to 50%, 30% or 10% of $\Delta t_h$. $\Delta t_{ph}$ is preferably no greater than 60 seconds, e.g., up to 40 seconds, up to 20 seconds, up to 10 seconds, or up to 5 seconds. The difference between $t_6$ and $t_5$ ($\Delta t_{pc}$) is a fraction of a time period ($\Delta t_c$) between $t_6$ and a next time point when pre-heated fluid begins flowing through the substrate support 100. For example, $\Delta t_c$ can be from 50 to 200 seconds, and $\Delta t_{pc}$ can be less than 50%, 30% or 10% of $\Delta t_h$. $\Delta t_c$ is preferably no greater than 60 seconds, e.g., less than 40 seconds, up to 20 seconds, up to 10 seconds or up to 5 seconds. $T_1$ is preferably from −10° C. to 50° C., more preferably from 10° C. to 50° C. $T_2$ is preferably from 30° C. to 110° C., more preferably from 70° C. to 110° C. $T_2$ is preferably at least 10° C. higher than $T_1$, e.g., at least 20° C., at least 30° C., at least 40° C., or at least 50° C. higher than $T_1$. The rate of change in $T_{sub}$ during $\tau_2$ is preferably at least 1° C./second. In an exemplary process wherein $T_{sub}$ is to be maintained in alternate steps at $T_1$ and $T_2$ for up to 50 seconds in each step, and $\tau_1$ is up to 50 seconds and $\tau_2$ is up to 25 seconds, a recirculation system according to an embodiment herein can enhance the throughput by about 33%.

Flow rates of the pre-heated liquid, the pre-cooled liquid, the first liquid and the second liquid can be constant or varied, e.g., the same or different flow rates. An exemplary flow rate is up to 30 liters per minute, e.g., about 18 liters per minute.

Described hereinbelow are implementations of the approach shown in FIG. 4, wherein a separate temperature control unit (pre-charge heating unit or PREH) and another separate temperature control unit (pre-charge cooling unit or PREC) are employed.

Figure 5A:
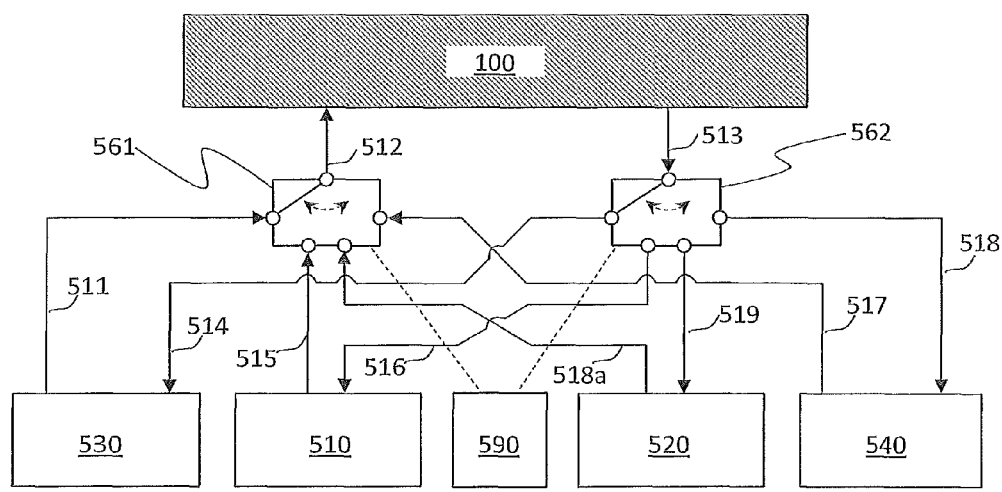
FIG. 5A is a diagram showing fluid connections between four temperature controlled fluid sources supplying fluid at different temperatures and a substrate support in a temperature control system according to embodiments described herein.

In a first embodiment, a recirculator is used as PREH and another recirculator is used as PREC, whereby, in conjunction with main recirculators, fluid can be circulated at any one of four temperatures ($T_1$, $T_2$, $T_{pc}$, $T_{ph}$). As shown in FIG. 5A, 510 is a main recirculator with a reservoir temperature of $T_1$; 530 is the PREC with a reservoir temperature of $T_{pc}$; 520 is a main recirculator with a reservoir temperature of $T_2$ which is greater than $T_1$ by at least 10° C., at least 20° C., at least 30° C., at least 40° C., at least 50° C., at least 60° C., or more; and 540 is the PREH with a reservoir temperature of $T_{ph}$. Valve arrangements 561 and 562 are automatically operated to cooperatively direct fluid from one of the recirculators into the substrate support 100. FIG. 5A is a simplified diagram showing logic connections between a controller 590 and the valve arrangements 561 and 562, which connect the recirculators 510-540 to the substrate support 100, without showing details of implementation. The PREC preferably cools fluid (liquid) at temperature $T_{pc}$ of at least 10° C., at least 20° C., at least 30° C., at least 40° C., at least 50° C., at least 60° C., or more below the temperature $T_1$ of the fluid circulated by recirculator 510. The PREH preferably heats fluid at temperature $T_{ph}$ of at least 10° C., at least 20° C., at least 30° C., at least 40° C., at least 50° C., at least 60° C., or more above the temperature $T_2$ of the fluid circulated by recirculator 520.

In the FIG. 5A implementation, fluid at $T_{pc}$ flows from recirculator 530 through line 511, valve 561, line 512, substrate support 100, line 513, valve 562, line 514 and back to recirculator 530. To switch over to fluid at $T_1$ from recirculator 510, valves 561, 562 are connected to lines 515, 516 so that fluid flows from recirculator 510, through line 515, valve 561, line 512, through substrate support 100, line 513, valve 562, line 516 and back to recirculator 510. To switch over to fluid at $T_{ph}$, valves 561, 562 are connected to lines 517, 518 so that fluid flows from recirculator 540, through line 517, valve 561, line 512, substrate support 100, line 513, valve 562, line 518 and back to recirculator 540. To circulate fluid at $T_2$, valves 561, 562 are connected to lines 518a, 519 and fluid from recirculator 520 passes through line 518a, valve 561, line 512, substrate support 100, line 513, valve 562, line 519 and back to recirculator 520. A controller 590 actuates the valves 561 and 562.

Figure 5B:
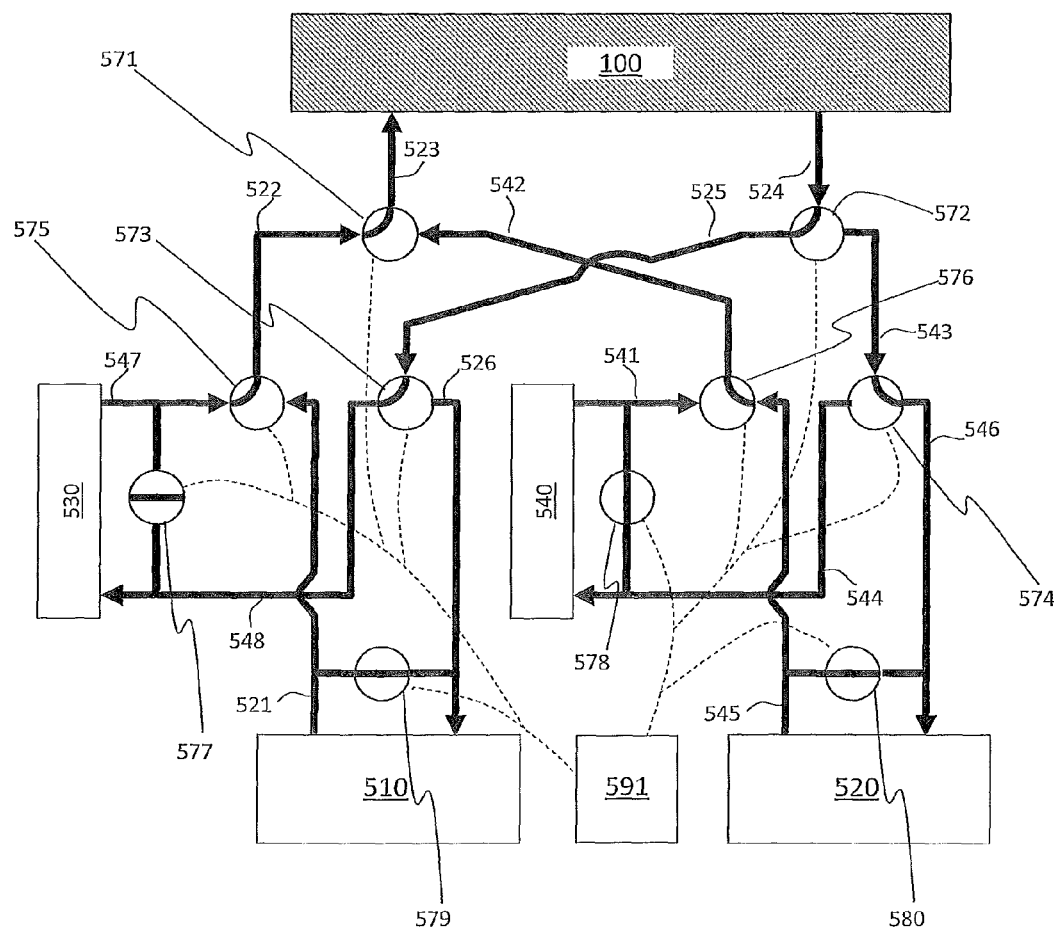
FIG. 5B shows a temperature control system according to an embodiment.
Figure 7A:
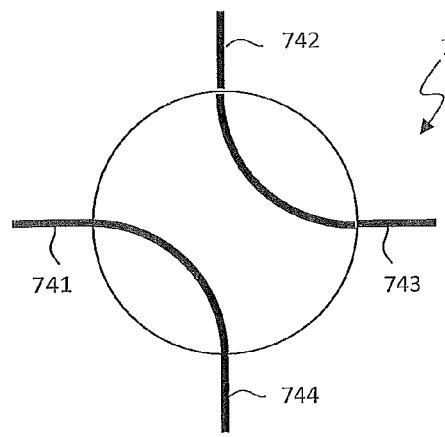
FIGS. 7A and 7B show schematics of two states of a four-way cross-over valve, respectively.
Figure 7B:
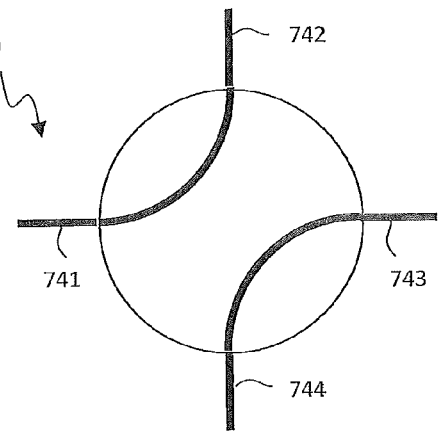
Figure 7C:
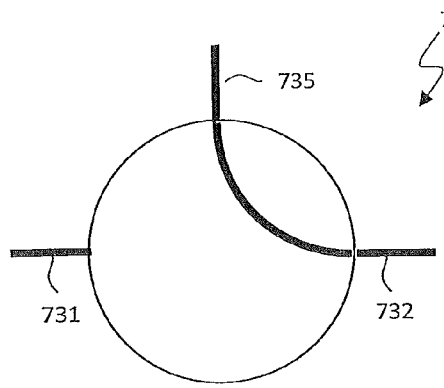
FIGS. 7C and 7D show schematics of two states of a three-way switching valve, respectively.
Figure 7D:
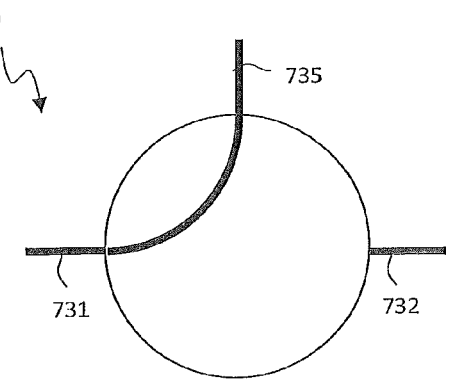

FIG. 5B shows one implementation of the first embodiment wherein a plurality of three-way switching valves 571-576 cooperatively direct fluid from one of the recirculators into the substrate support 100. As shown in FIGS. 7C and 7D, a three-way switching valve 730 has a common path 735, a first branching path 731 and a second branching path 732. The three-way switching valve 730 is operable to establish fluidic communication between the common path 735 and the first branching path 731, or between the common path 735 and the second branching path 732. Three-way switching valves which can be used include Swagelok 40 series and 40G series valves. The three-way switching valve 730 can be electronically actuated.

Referring to FIG. 4 and FIG. 5B, before time $t_3$, fluid at $T_1$ flows from the recirculator 510, sequentially through line 521, valve 575, line 522, valve 571, line 523, substrate support 100, line 524, valve 572, line 525, valve 573, line 526, and back to the recirculator 510. Between times $t_3$ and $t_4$, fluid at $T_{ph}$ flows from the recirculator 540, sequentially through line 541, valve 576, line 542, valve 571, line 523, substrate support 100, line 524, valve 572, line 543, valve 574, line 544, and back to the recirculator 540. Between times $t_4$ and $t_5$, fluid at $T_2$ flows from the recirculator 520, sequentially through line 545, valve 576, line 542, valve 571, line 523, substrate support 100, line 524, valve 572, line 543, valve 574, line 546, and back to the recirculator 520. Between times $t_5$ and $t_6$, fluid at $T_{pc}$ flows from the recirculator 530, sequentially through line 547, valve 575, line 522, valve 571, line 523, substrate support 100, line 524, valve 572, line 525, valve 573, line 548, and back to the recirculator 530. After time $t_6$, the flow pattern is the same as that before time $t_3$. Two-way valves 577, 579, 578 and 580 are connected between the branch lines leading to the inlets and the outlets of the recirculators 530, 510, 540 and 520, respectively. A controller 591 actuates the valves 571-580.

Figure 7E:
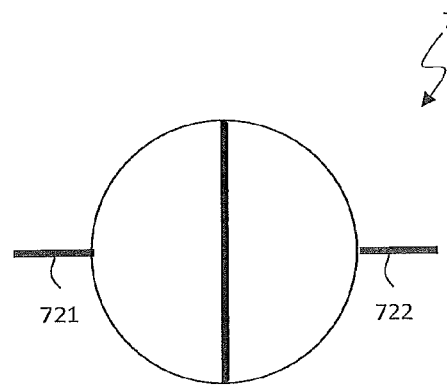
FIGS. 7E and 7F show schematics of two states of a two-way valve, respectively.
Figure 7F:
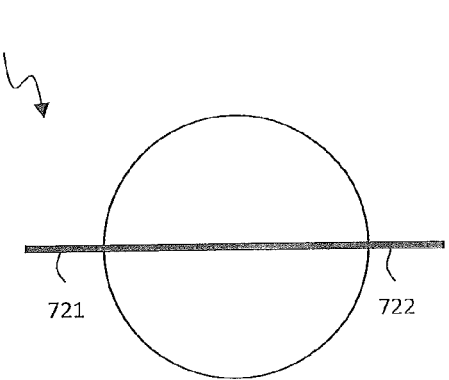

As shown in FIGS. 7E and 7F, a two-way valve 720 has two flow paths 721 and 722 and is operable to establish or eliminate fluidic communication between the two paths 721 and 722. Details of an exemplary two-way valve can be found in Swagelok 40 series and 40G series catalog. The three-way switching valve 720 can be electronically actuated. The two-way valves are operable to open and allow fluid in their respective recirculators to circulate only when fluid is not flowing from their respective recirculators into the substrate support 100.

Figure 5C:
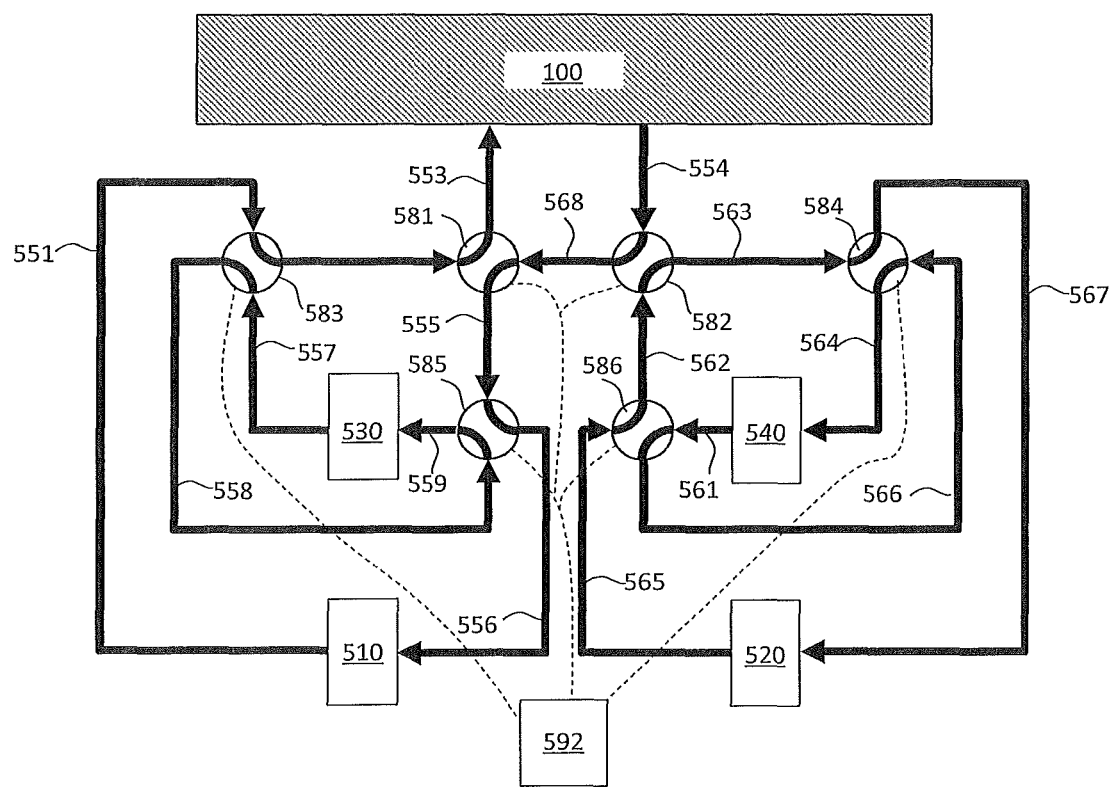
FIG. 5C shows a temperature control system according to an embodiment.

FIG. 5C shows another arrangement of the first embodiment, wherein a plurality of four-way crossover valves 581-586 cooperatively direct fluid from one of the recirculators into the substrate support 100. As shown in FIGS. 7A and 7B, a four-way crossover valve 740 has a first path 741, a second path 742, a third path 743 and a fourth path 744. The four-way crossover valve 740 is operable to establish fluidic communication between the first and second paths 741 and 742 and between the third and fourth paths 743 and 744, as shown in FIG. 7B, or between the first and fourth paths 741 and 744 and between the second and third paths 742 and 743, as shown in FIG. 7A. Details of an exemplary four-way crossover valve can be found in Swagelok 40 series and 40G series catalog. The four-way crossover valve 740 can be electronically actuated.

Referring FIG. 4 and FIG. 5C, before time $t_3$, fluid at $T_1$ flows from the recirculator 510, sequentially through line 551, valve 583, line 552, valve 581, line 553, substrate support 100, line 554, valve 582, line 568, valve 581, line 555, valve 585, line 556, and back to the recirculator 510. At the same time, the other recirculators can be maintained in standby mode such that fluid from the recirculator 530 circulates through line 557, the valve 583, line 558, valve 585 and line 559 back to the recirculator 530; fluid from the recirculator 540 circulates through line 561, the valve 586, line 562, valve 582, line 563, valve 584, line 564 and back to recirculator 540; fluid from the recirculator 520 circulates through line 565, the valve 586, line 566, valve 584 and line 567 back to recirculator 540.

Between times $t_3$ and $t_4$, fluid at $T_{ph}$ flows from the recirculator 540, sequentially through line 561, valve 586, line 562, valve 582, line 568, valve 581, line 553, substrate support 100, line 554, valve 582, line 563, valve 584, line 564, and back to the recirculator 540. At the same time, fluid from the recirculator 530 circulates through line 557, valve 583, line 552, valve 581, line 555, valve 585, line 559 back to recirculator 530; fluid from the recirculator 510 circulates through line 551, valve 583, line 558, valve 585, line 556 back to recirculator 510; and fluid from the recirculator 520 circulates through line 565, valve 586, line 566, valve 584, line 567 back to recirculator 520.

Between times $t_4$ and $t_5$, fluid at $T_2$ flows from the recirculator 520, sequentially through line 565, valve 586, line 562, valve 582, line 568, valve 581, line 553, substrate support 100, line 554, valve 582, line 563, valve 584, line 567, and back to the recirculator 520. At the same time, fluid from the recirculator 530 circulates through lines 557, 558, 559 and valves 583 and 585; fluid from the recirculator 510 circulates through lines 551, 552, 555, 556 and valves 583, 581 and 585; and fluid from the recirculator 540 circulates through line 561, valve 586, line 566, valve 584, line 564 back to recirculator 540.

Between times $t_5$ and $t_6$, fluid at $T_{pc}$ flows from the recirculator 530, sequentially through line 557, valve 583, line 552, valve 581, line 553, substrate support 100, line 554, valve 582, line 568, valve 581, line 555, valve 585, line 559, and back to the recirculator 530. At the same time, fluid from the recirculator 510 circulates through line 551, valve 583, line 558, valve 585 and line 556 back to recirculator 510; fluid from the recirculator 540 circulates through line 561, valve 586, line 562, valve 582, line 563, valve 584, line 564 and back to recirculator 540; and fluid from the recirculator 520 circulates through line 565, valve 586, line 566, valve 584, line 567 and back to recirculator 520. After time $t_6$, the flow pattern is the same as that before time $t_3$. A controller 592 actuates the valves 581-586.

The embodiment shown in FIG. 5C has an advantage in that fluid in the entire circulation system flows at all times (i.e. without dead volume) and fluid at any one of the four temperatures $T_1$, $T_2$, $T_{pc}$, $T_{ph}$ can be readily supplied to the substrate support.

Figure 6A:
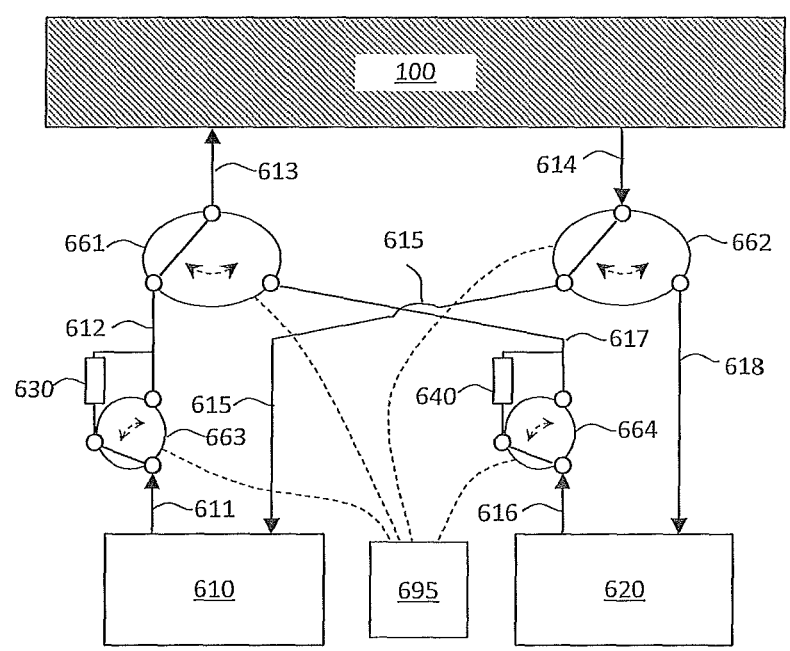
FIG. 6A is a diagram showing fluid connections between four temperature controlled fluid sources supplying fluid at different temperatures and a substrate support in a temperature control system according to embodiments described herein.

A second embodiment uses two online heating and cooling units as PREH and PREC. Online units have small internal volumes and can be described as simple thermal masses supported by independent energy sources. Inherent heat capacity of an online unit is sufficiently large to change fluid temperature between $T_1$, $T_2$, $T_{pc}$, and $T_{ph}$ as fluid passes through the online unit. An online unit can be a Noah Precision POU 3300/3500, a Komatsu FRV-6000 or any suitable equivalent. As shown in FIG. 6A, 610 is a main recirculator with a low reservoir temperature of $T_1$; an online cooling unit 630 functions as the PREC by cooling fluid flowing from the main recirculator 610 through the online unit 630 to a temperature of $T_{pc}$; 620 is a main recirculator with a high reservoir temperature of $T_2$; and an online heating unit 640 functions as the PREH by heating fluid flowing from the main recirculator 620 through the online unit 640 to a temperature of $T_{ph}$. A valve 663 is operable to direct fluid passing through line 611 from the main recirculator 610 so as to bypass or pass through the online unit 630, through line 612, valve 661, line 613, substrate support 100, line 614, valve 662, line 615 and back to recirculator 610. A valve 664 is operable to direct fluid passing through line 616 from the main recirculator 620 so as to bypass or pass through the online unit 640 through line 617, valve 661, line 613, substrate support 100, line 614, valve 662, line 618 and back to recirculator 620. Valves 661 and 662 cooperatively direct fluid from one of the recirculators 610 and 620, or one of the online units 630 and 640, into the substrate support 100. FIG. 6A is a simplified diagram showing logic connections between the recirculators, online units and the substrate support 100, without showing all details of implementation. A controller 695 actuates valves 661-664.

Figure 6B:
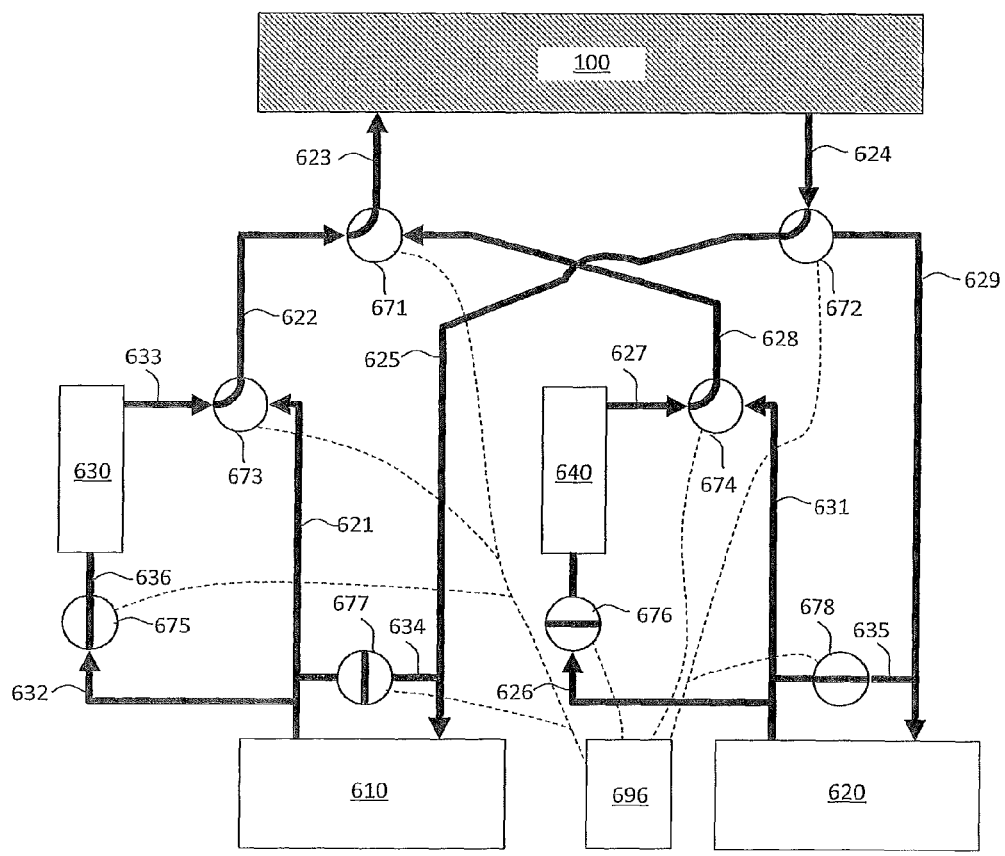
FIG. 6B shows a temperature control system according to an embodiment.

FIG. 6B shows an implementation of the second embodiment, wherein a plurality of three-way switching valves 671-674 and two-way valves 675-676 cooperatively direct fluid from one of the recirculators or one of the online units into the substrate support 100. Referring to FIG. 4 and FIG. 6B, before time $t_3$, fluid at $T_1$ flows through line 621 from the recirculator 610, sequentially through valve 673, line 622, valve 671, line 623, substrate support 100, line 624, valve 672, line 625, and back to the recirculator 610. Between times $t_3$ and $t_4$, fluid at $T_{ph}$ flows through line 626 from the recirculator 620, sequentially through valve 676, online unit 640, line 627, valve 674, line 628, valve 671, line 623, substrate support 100, line 624, valve 672, line 629, and back to the recirculator 620. Between times $t_4$ and $t_5$, fluid at $T_2$ flows from the recirculator 620, sequentially through line 631, valve 674, line 628, valve 671, line 623, substrate support 100, line 624, valve 672, line 629 and back to the recirculator 620. Between times $t_5$ and $t_6$, fluid at $T_{pc}$ flows from the recirculator 610, sequentially through line 632, valve 675, line 636, online unit 630, line 633, valve 673, line 622, valve 671, line 623, substrate support 100, line 624, valve 672, line 625, and back to the recirculator 610. After time $t_6$, the flow pattern is the same as that before time $t_3$.

A two-way valve 677 is located along branch line 634 extending between lines 621 and 625 to the inlet and outlet of the recirculator 610. A two-way valve 678 is located along branch line 635 extending between lines 631 and 629 to the inlet and outlet of the recirculator 620. The two-way valves 677 and 678 are operable to open and allow fluid in their respective recirculators to locally circulate only when their respective recirculators are not feeding fluid into the substrate support 100, either directly or through an online unit. The two-way valve 675 and the valve 673 cooperatively direct fluid from the recirculator 610 so as to pass through or bypass the online unit 630. The two-way valve 676 and the valve 674 cooperatively direct fluid from the recirculator 620 so as to pass through or bypass the online unit 640. A controller 696 actuates valves 671-678.

Figure 6C:
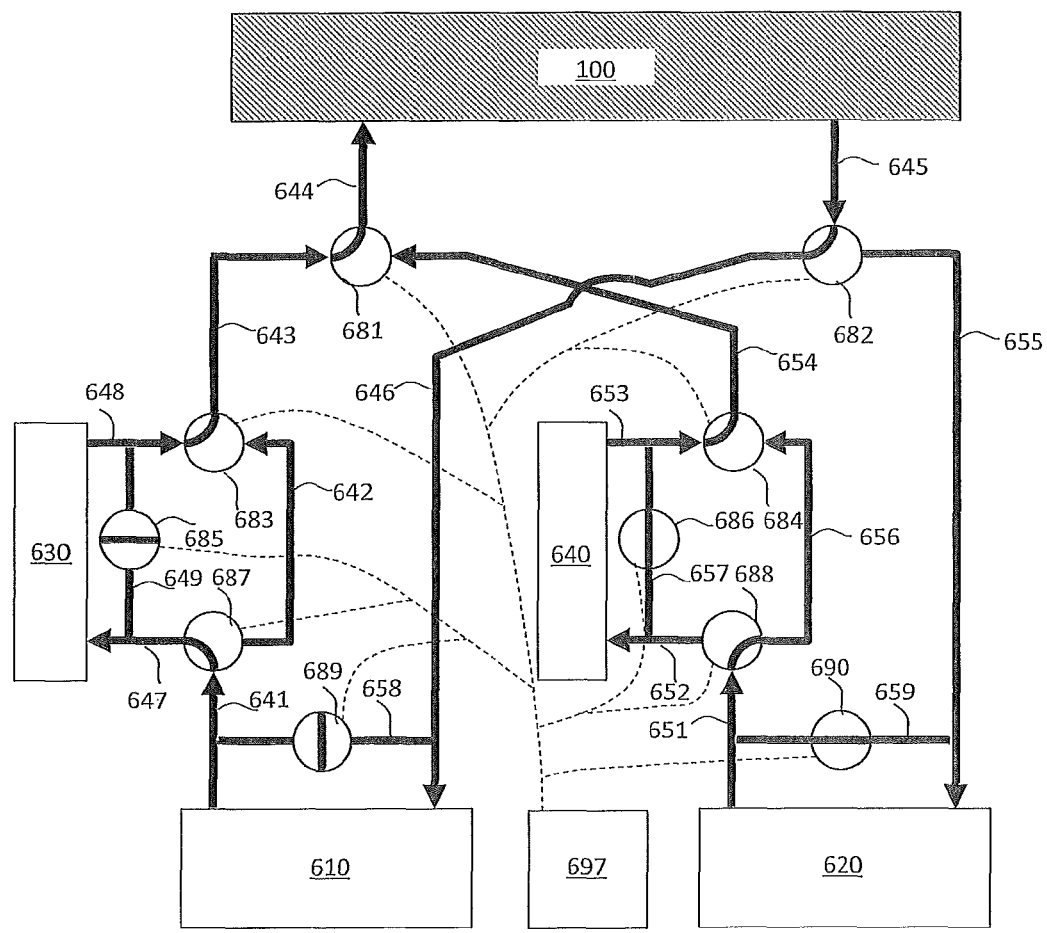
FIG. 6C shows a temperature control system according to an embodiment.

FIG. 6C shows another implementation of the second embodiment, wherein a plurality of three-way switching valves 681-684 and 687-688 cooperatively direct fluid from one of the recirculators or one of the online units into the substrate support 100. Referring to FIG. 4 and FIG. 6C, before time $t_3$, fluid at $T_1$ flows from the recirculator 610, sequentially through line 641, valve 687, line 642, valve 683, line 643, valve 681, line 644, substrate support 100, line 645, valve 682, line 646, and back to the recirculator 610. Between times $t_3$ and $t_4$, fluid at $T_{ph}$ flows from the recirculator 620, sequentially through line 651, valve 688, line 652, online unit 640, line 653, valve 684, line 654, valve 681, line 644, substrate support 100, line 645, valve 682, line 655, and back to the recirculator 620. Between times $t_4$ and $t_5$, fluid at $T_2$ flows from the recirculator 620, sequentially through line 651, valve 688, line 656, valve 684, line 654, valve 681, line 644, substrate support 100, line 645, valve 682, line 655, and back to the recirculator 620. Between times $t_5$ and $t_6$, fluid flows from the recirculator 610, sequentially through line 641, valve 687, line 647, online unit 630, line 648, valve 683, line 643, valve 681, line 644, substrate support 100, line 645, valve 682, line 646, and back to the recirculator 610. After time $t_6$, the flow pattern is the same as that before time $t_3$.

Two-way valves 685, 686, 689 and 690 located along branch lines 649, 657, 658, 659 which are connected between inlets and outlets of the online units 630 and 640 and the recirculators 610 and 620, respectively. The two-way valves 689 and 690 are operable to open and allow fluid in the recirculators 620 to locally recirculate while fluid is fed to the substrate support 100 via recirculator 610 either directly or through online unit 630 or fluid is recirculated locally through branch line 658 to recirculator 610 while recirculator 620 supplies fluid to the substrate support 100. The two-way valves 685 and 686 are operable to open and allow fluid in their respective online units to locally recirculate when the online units are not feeding fluid into the substrate support 100. With this arrangement, valves 687 and 683 can cooperatively direct fluid from the recirculator 610 so as to pass through or bypass the online unit 630. Likewise, valves 688 and 684 can cooperatively direct fluid from the recirculator 620 so as to pass through or bypass the online unit 640. A controller 697 actuates valves 681-690.

Figure 6D:
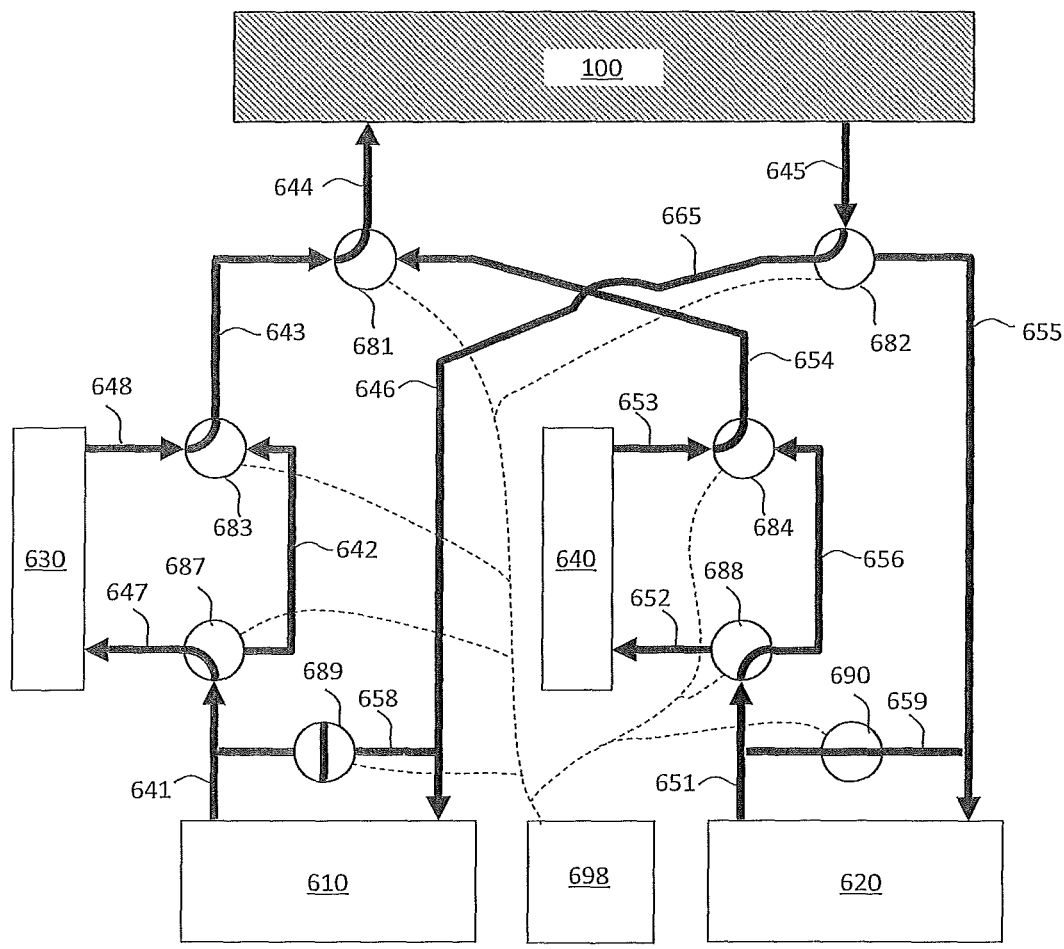
FIG. 6D shows a temperature control system according to an embodiment.

FIG. 6D shows another implementation of the second embodiment, identical to the embodiment in FIG. 6C except that the two-way valves 685 and 686 are omitted. A controller 698 actuates valves 681-684 and 687-690.

Figure 6E:
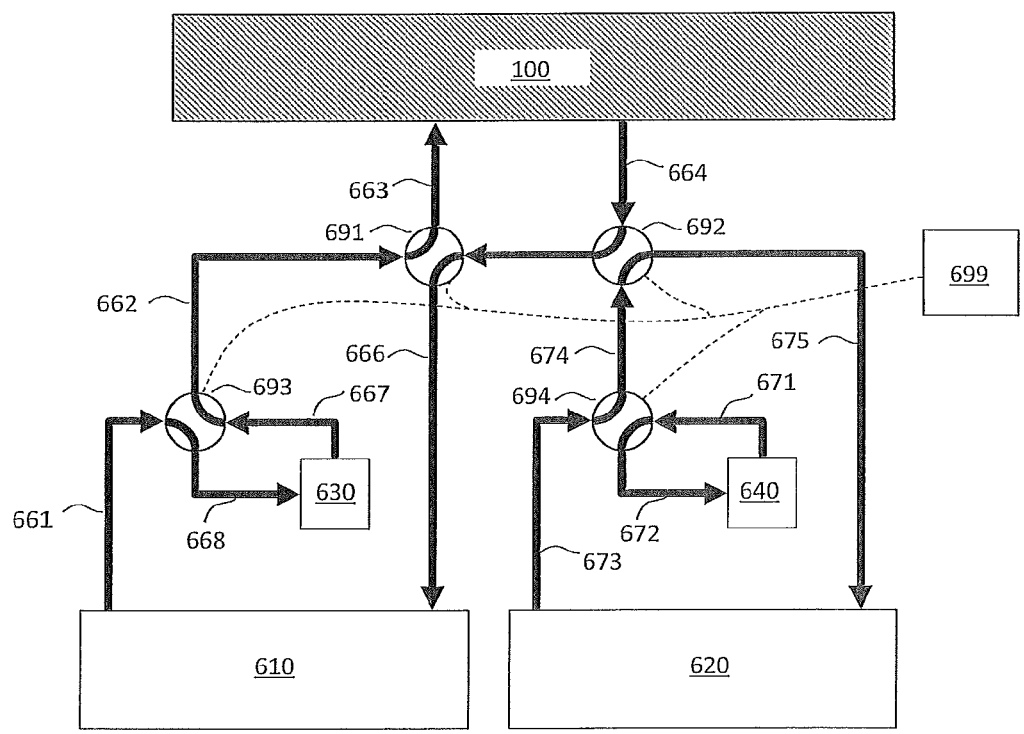
FIG. 6E shows a temperature control system according to an embodiment.

FIG. 6E shows another implementation of the second embodiment, wherein a plurality of four-way crossover valves 691-694 cooperatively direct fluid from one of the recirculators or the online units into the substrate support 100. A controller 699 actuates valves 691-694.

Referring FIG. 4 and FIG. 6E, before time $t_3$, fluid at $T_1$ flows through line 661 from the recirculator 610, sequentially through valve 693, line 662, valve 691, line 663, substrate support 100, line 664, valve 692, line 665, valve 691, line 666, and back to the recirculator 610. At the same time, fluid from the online unit 630 circulates through lines 667, 668 and valve 693; fluid from the online unit 640 circulates through lines 671, 672 and valve 694; and fluid from the recirculator 620 circulates through lines 673, 674, 675 and the valves 694 and 692.

Between times $t_3$ and $t_4$, fluid at $T_{ph}$ flows from the recirculator 620, sequentially through line 673, valve 694, line 672, online unit 640, line 671, valve 694, line 674, valve 692, line 665, valve 691, line 663, substrate support 100, line 664, valve 692, line 675, and back to the recirculator 620. At the same time, fluid from the online unit 630 circulates through lines 667, 668 and valve 693; and fluid from the recirculator 610 circulates through lines 661, 662, 666 and valves 693 and 691.

Between times $t_4$ and $t_5$, fluid at $T_2$ flows from the recirculator 620, sequentially through line 673, valve 694, line 674, valve 692, line 665, valve 691, line 663, substrate support 100, line 664, valve 692, line 675, and back to the recirculator 620. At the same time, fluid from the online unit 630 circulates through lines 667, 668 and valve 693; fluid from the recirculator 610 circulates through lines 661, 662, 666 and valves 693 and 691; and fluid from the online unit 640 circulates through lines 671, 672 and valve 694.

Between times $t_5$ and $t_6$, fluid at $T_{pc}$ flows from the recirculator 610, sequentially through line 661, valve 693, line 668, online unit 630, line 667, valve 693, line 662, valve 691, line 663, substrate support 100, line 664, valve 692, line 665, valve 691, line 666, and back to the recirculator 610. At the same time, fluid from the recirculator 620 circulates through lines 673, 674, 675 and valves 694 and 692; and fluid from the online unit 640 circulates through lines 671, 672 and valve 694. After time $t_6$, the flow pattern is the same as that before time $t_3$.

The embodiment shown in FIG. 6E has an advantage in that fluid in the entire circulation system flows at all times (i.e. without dead volume) and its temperatures can be individually regulated by the recirculators 610, 620 and online units 630, 640.

Figure 6F:
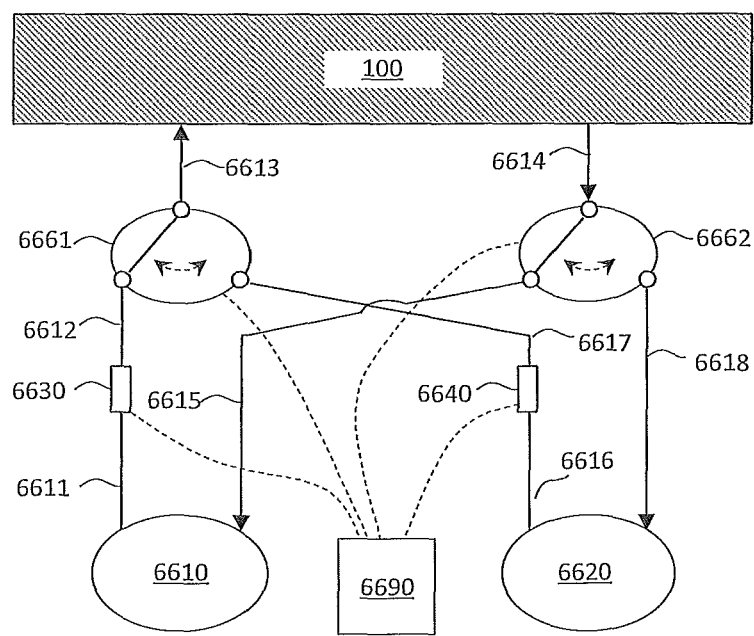
FIG. 6F shows a temperature control system according to an embodiment.

FIG. 6F shows an implementation wherein one online unit 6630 is used to provide fluid at $T_1$ or $T_{pc}$, another online unit 6640 is used to provide fluid at $T_2$ or $T_{ph}$. Circulation pumps 6610 and 6620 drive fluid through the substrate support 100 and the online units 6630 and 6640. A controller 6690 actuates valves 6661 and 6662 to direct fluid from the online units 6630 and 6640 through the substrate support 100, set fluid temperature from the online unit 6630 to $T_1$ or $T_{pc}$, and set fluid temperature from the online unit 6640 to $T_2$ or $T_{ph}$. The valve 6661 is operable to direct fluid passing through line 6611 from the circulation pump 6610 to pass through the online unit 6630, through line 6612, valve 6661, line 6613, substrate support 100, line 6614, valve 6662, line 6615 and back to circulation pump 6610. The valve 6662 is operable to direct fluid passing through line 6616 from the circulation pump 6620 to pass through the online unit 6640 through line 6617, valve 6661, line 6613, substrate support 100, line 6614, valve 6662, line 6618 and back to circulation pump 6620. Valves 6661 and 6662 cooperatively direct fluid from one of the online units 6630 and 6640, into the substrate support 100. FIG. 6F is a simplified diagram showing logic connections between the circulation pump, online units and the substrate support 100, without showing all details of implementation.

Figure 8:
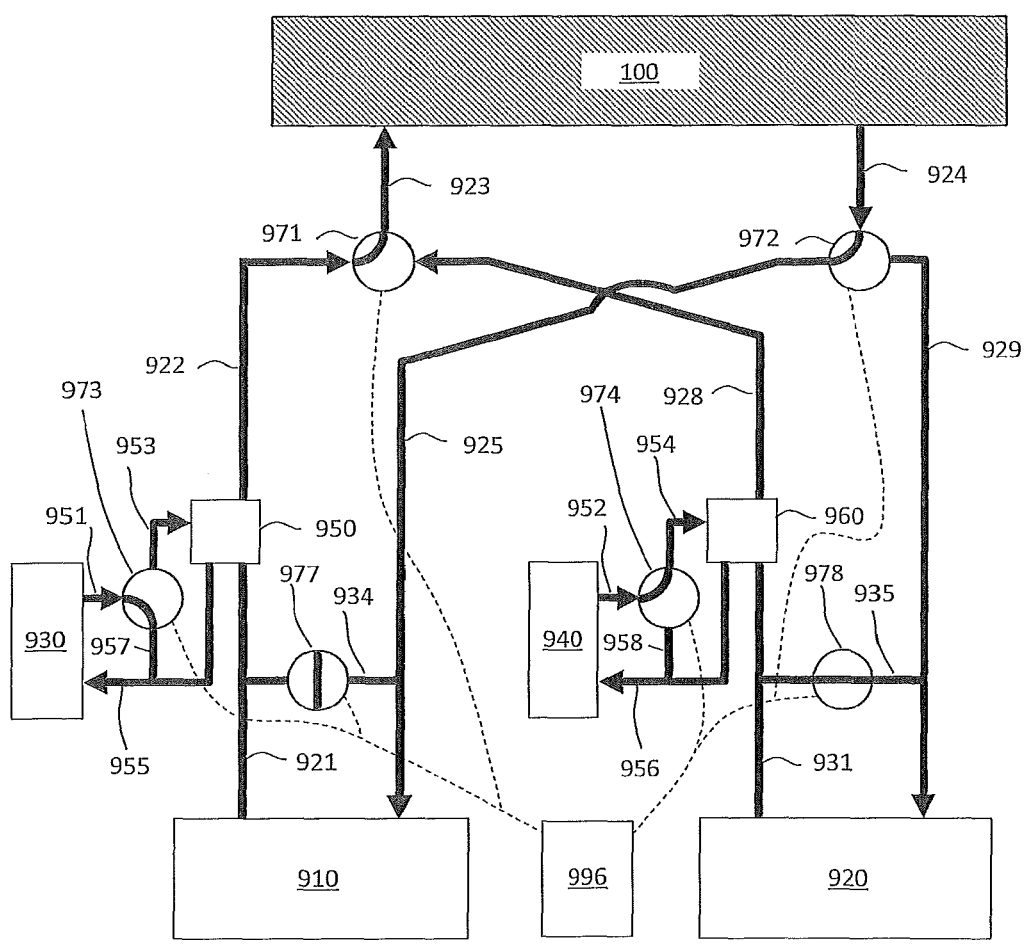
FIG. 8 shows a temperature control system according to an embodiment.

FIG. 8 shows an embodiment wherein two three-way switching valves 971-972 cooperatively direct fluid from one of recirculators 910 and 920 into the substrate support 100 and two three-way switching valves 973 and 974 set temperature of the fluid from the recirculators 910 and 920.

Referring to FIG. 4 and FIG. 8, before time $t_3$, fluid at $T_1$ flows from the recirculator 910, sequentially through line 921, thermal mass 950, line 922, valve 971, line 923, substrate support 100, line 924, valve 972, line 925, and back to the recirculator 910; at the same time, fluid at $T_{pc}$ flows from a pre-cooling unit 930, sequentially through line 951, valve 973, line 957 and back to the pre-cooling unit 930 so as to bypass thermal mass 950; the fluid from the recirculator 910 passing through thermal mass 950 is not heated or cooled but instead remains at $T_1$; fluid at $T_{ph}$ flows from the pre-heating unit 940, sequentially through line 952, valve 974, line 954, thermal mass 960, line 956 and back to the pre-heating unit 940; the fluid from the pre-heating unit 940 and the thermal mass 960 are in thermal equilibrium at $T_{ph}$; fluid at $T_2$ flows from the recirculator 920, sequentially through line 931, line 935, valve 978, line 929 and back to the recirculator 920 to bypass the thermal mass 960.

Between times $t_3$ and $t_4$, fluid at $T_1$ flows from the recirculator 910, sequentially through line 921, line 934, valve 977, line 925, and back to the recirculator 910; at the same time, fluid at $T_{pc}$ flows from a pre-cooling unit 930, sequentially through line 951, valve 973, line 953, thermal mass 950, line 955 and back to the pre-cooling unit 930; the thermal mass 950 reaches thermal equilibrium with the fluid from the pre-cooling unit 930 at $T_{pc}$ before $t_5$; fluid at $T_{ph}$ flows from the pre-heating unit 940, sequentially through line 952, valve 974, line 954, thermal mass 960, line 956 and back to the pre-heating unit 940; the fluid from the pre-heating unit 940 and the thermal mass 960 are in thermal equilibrium at $T_{ph}$; fluid at $T_2$ flows from the recirculator 920, sequentially through line 931, thermal mass 960 such that the fluid from the recirculator 920 is heated from $T_2$ to $T_{ph}$, line 971, valve 971, line 923, substrate support 100, line 924, valve 972, line 929, and back to the recirculator 920.

Between times $t_4$ and $t_5$, fluid at $T_1$ flows from the recirculator 910, sequentially through line 921, line 934, valve 977, line 925, and back to the recirculator 910; fluid at $T_{pc}$ flows from the pre-cooling unit 930, sequentially through line 951, valve 973, line 953, thermal mass 950, line 955 and back to the pre-cooling unit 930; the thermal mass 950 reaches thermal equilibrium with the fluid from the pre-cooling unit 930 at $T_{pc}$ before $t_5$; at the same time, fluid at $T_{ph}$ flows from the pre-heating unit 940, sequentially through line 952, valve 974, line 958, and back to the pre-heating unit 940; fluid at $T_2$ flows from the recirculator 920, sequentially through line 931, thermal mass 960, line 971, valve 971, line 923, substrate support 100, line 924, valve 972, line 929, and back to the recirculator 920; the fluid from the recirculator 920 and the thermal mass 960 are in thermal equilibrium at $T_2$.

Between times $t_5$ and $t_6$, fluid at $T_1$ flows from the recirculator 910, sequentially through line 921, thermal mass 950 such that the fluid from the recirculator 910 is cooled from $T_1$ to $T_{pc}$, line 922, valve 971, line 923, substrate support 100, line 924, valve 972, line 925, and back to the recirculator 910; at the same time, fluid at $T_{pc}$ flows from a pre-cooling unit 930, sequentially through line 951, valve 973, line 953, thermal mass 950, line 955 and back to the pre-cooling unit 930; the fluid from a pre-cooling unit 930 and the thermal mass 950 are in thermal equilibrium at $T_{pc}$; fluid at $T_{ph}$ flows from the pre-heating unit 940, sequentially through line 952, valve 974, line 954, thermal mass 960, line 956 and back to the pre-heating unit 940; the thermal mass 960 reaches thermal equilibrium with the fluid from the pre-heating unit 940 at $T_{ph}$ before the substrate support 100 is heated; fluid at $T_2$ flows from the recirculator 920, sequentially through line 931, line 935, valve 978, line 929, and back to the recirculator 920.

After time $t_6$, the flow pattern is the same as that before time $t_3$.

Two-way valves 977 and 978 located along branch lines 934 and 935 which are connected between inlets and outlets of the recirculators 910 and 920, respectively. A controller 996 actuates valves 971-974 and 977-978. The liquid from the pre-cooling unit 930 does not intermix with the liquid from the recirculator 910; the liquid from the recirculator 940 does not intermix with the liquid from the recirculator 920.

The circulation system can be used to direct liquids through a flow passage covering the entire substrate support or through a flow passage covering a zone of the substrate support.

The circulation system comprising the valves and flow lines can further comprise a suitable logic control unit and suitable actuation mechanisms for automatically controlling and actuating the valves according to preprogrammed process recipes and/or in response to process monitoring systems.

The circulation system described herein can be used with any semiconductor processing apparatuses wherein it is desired to effect rapid temperature of a substrate support needs rapid switching, e.g. a plasma etcher or a chemical vapor deposition system. Examples of such apparatuses and processes can be found in commonly assigned U.S. Pat. Nos. 7,274,004, 6,847,014, 6,770,852, the disclosures of which is incorporated by reference in their entirety.

Figure 9:
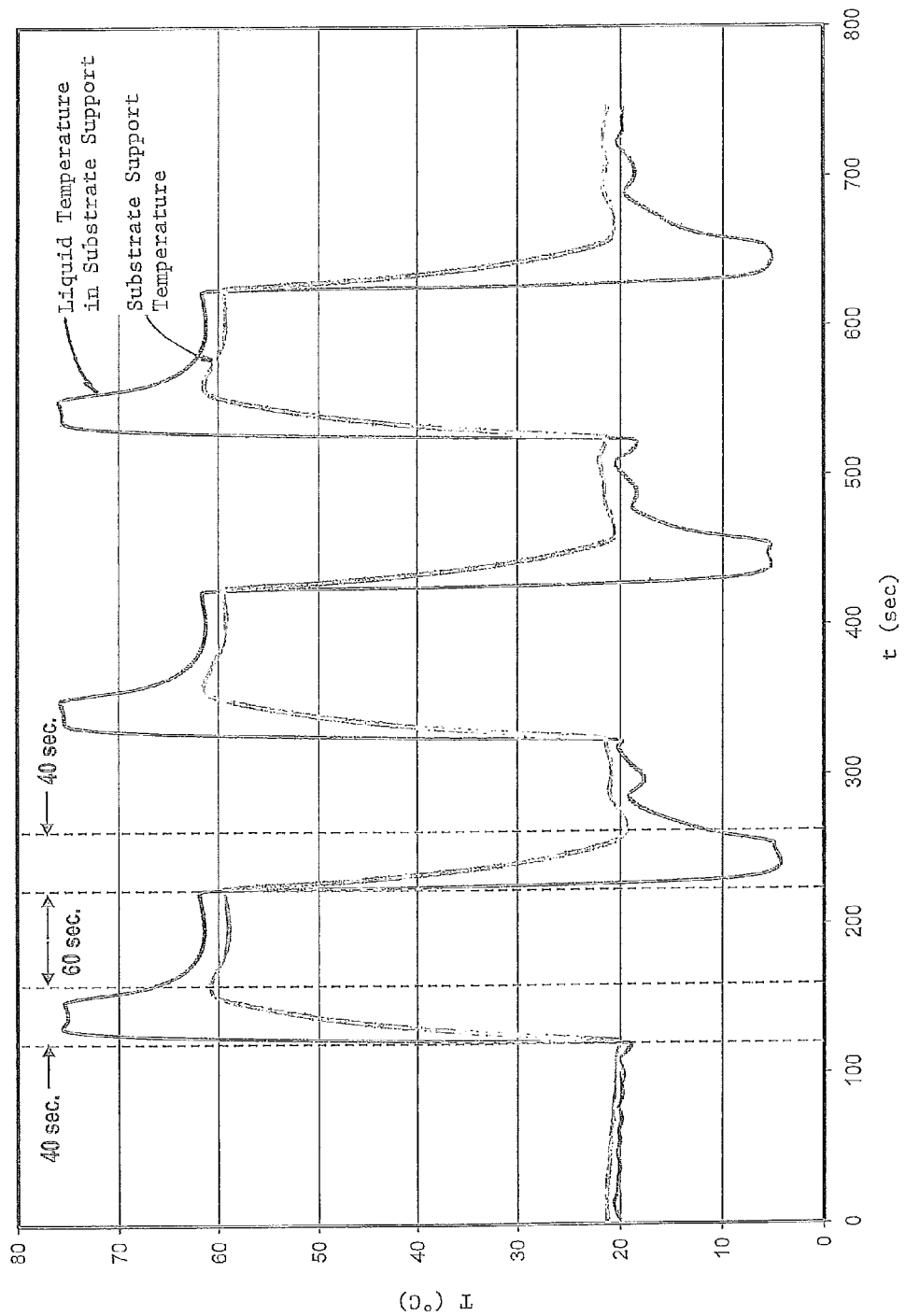
FIG. 9 shows actual test data on an exemplary multistep process.

An exemplary circulation system according to an embodiment has a cooling capacity of 4000 W with recirculators capable of providing liquids from −10 to 90° C. at 18 L/min at a pressure up to 100 psi. In an exemplary process, $T_2$ is greater than $T_1$ by at least 50° C. $T_1$ and $T_2$ are from 10 to 75° C. The substrate support can have a heat capacity of 5000 J/° C. and $\Delta t_h$ and $\Delta t_c$ can be at least four times the difference between $T_1$ and $T_2$ in ° C. FIG. 9 shows representative temperature data for an exemplary multistep process. An exemplary multistep process can comprise applying an RF bias to a semiconductor substrate by supplying radio frequency power to the substrate support, energizing process gas into a plasma state and plasma etching openings into a layer of material on the semiconductor substrate, the opening being etched for a first time period $\Delta t_c$ while supplying liquid at $T_1$ to the flow passage and for a second timer period $\Delta t_h$ while supplying liquid at $T_2$ to the flow passage.

While the temperature control system for a substrate support has been described in detail with reference to specific embodiments thereof, it will be apparent to those skilled in the art that various changes and modifications can be made, and equivalents employed, without departing from the scope of the appended claims. The temperature control system described herein is not limited to plasma processing systems, but can be used in any suitable apparatus wherein a substrate support is incorporated.

We claim:

1. A plasma processing system including a recirculation system useful for supplying temperature controlled liquid to a substrate support on which a semiconductor substrate subject to a multistep process is supported during processing in a semiconductor processing chamber, the system comprising:
    a supply line adapted to deliver liquid to an inlet of the substrate support, the substrate support including a flow passage through which the liquid is circulated for purposes of maintaining a thermal zone on a surface of the substrate support at a desired temperature;
    a return line adapted to return liquid from an outlet of the substrate support after the liquid is circulated through the flow passage;
    a first recirculator operable to supply liquid at temperature $T_1$ to the supply line and receive liquid from the return line, the first recirculator being in fluid communication with the supply line and the return line;
    a second recirculator operable to supply liquid at temperature $T_2$ to the supply line and receive liquid from the return line, the second recirculator in fluid communication with the supply line and the return line, wherein temperature $T_2$ is at least 10° C. above temperature $T_1$;

a pre-cooling unit operable to supply liquid at temperature $T_{pc}$ to the supply line, wherein temperature $T_{pc}$ is at least 10° C. below $T_1$;

a pre-heating unit operable to supply liquid at temperature $T_{ph}$ to the supply line, wherein temperature $T_{ph}$ is at least 10° C. above $T_2$;

electronically actuated valves operable to supply liquid at $T_1$, $T_2$, $T_{pc}$ or $T_{ph}$ to the supply line by connecting the first recirculator or the second recirculator to the supply and return lines or circulating liquid in or through the pre-cooling unit and the pre-heating unit.

2. The system of claim 1, further comprising a controller operable to direct liquid at $T_{pc}$ for a time period $\Delta t_{pc}$ through the supply line and the return line, immediately prior to directing liquid at $T_1$ for a time period $\Delta t_c$ through the supply line and the return line, so as to maintain a thermal zone of the substrate support at temperature $T_1$ for the time period $\Delta t_c$ during a portion of the multistep process, wherein $\Delta t_{pc}$ is a fraction of $\Delta t_c$.

3. The system of claim 2, wherein the controller is operable to direct liquid at $T_{ph}$ for a time period $\Delta t_{ph}$ through the supply line and the return line, immediately prior to directing liquid at $T_2$ for a time period $\Delta t_h$ through the supply line and the return line, so as to maintain the thermal zone of the substrate support at temperature $T_2$ for the time period $\Delta t_h$ during a portion of the multistep process, wherein $\Delta t_{ph}$ is a fraction of $\Delta t_h$.

4. The system of claim 3, wherein:
the supply line is connected to a first valve;
the return line is connected to a second valve;
the first valve is in fluid communication with an outlet of the first recirculator, an outlet of the pre-cooling unit, an outlet of the second recirculator, and an outlet of the pre-heating unit;
the second valve is in fluid communication with an inlet of the first recirculator, an inlet of the pre-cooling unit, an inlet of the second recirculator, and an inlet of the pre-heating unit;
the controller is operable to selectively operate the first and second valves to direct liquid at temperature $T_1$, $T_2$, $T_{pc}$ or $T_{ph}$ through the supply line and the return line.

5. The system of claim 4, wherein:
the first valve is connected to the inlet of the first recirculator, the inlet of the second recirculator, the inlet of the pre-heating unit and the inlet of the pre-cooling unit;
the second valve is connected to the outlet of the first recirculator, the outlet of the second recirculator, the outlet of the pre-heating unit and the outlet of the pre-cooling unit.

6. The system of claim 4, wherein:
the first valve is a first three-way switching valve;
the second valve is a second three-way switching valve;
the first three-way switching valve is connected to a third three-way switching valve and a fourth three-way switching valve;
the second three-way switching valve is connected to a fifth three-way switching valve and a six three-way switching valve;
the third three-way switching valve is connected to the outlet of the pre-cooling unit, and the outlet of the first recirculator;
the fifth three-way switching valve is connected to the inlet of the pre-cooling unit, and the inlet of the first recirculator;
the fourth three-way switching valve is connected to the outlet of the pre-heating unit, and the outlet of the second recirculator;

the sixth three-way switching valve is connected to the inlet of the pre-heating unit, and the inlet of the second recirculator;
a first valved branch line is connected to the outlet and the inlet of the pre-cooling unit;
a second valved branch line is connected to the outlet and the inlet of the pre-heating unit;
a third valved branch line is connected to the outlet and the inlet of the first recirculator;
a fourth valved branch line is connected to the outlet and the inlet of the second recirculator;
the controller is operable to selectively operate valves of the first, second, third and fourth valved branch lines and the first, second, third, fourth, fifth and sixth three-way switching valves to direct liquid at temperature $T_1$, $T_2$, $T_{pc}$ or $T_{ph}$ through the supply line and the return line.

7. The system of claim 4, wherein:
the first valve is a first four-way crossover valve;
the second valve is a second four-way crossover valve;
the first four-way crossover valve is connected to the second four-way crossover valve, a third four-way crossover valve, and a fifth four-way crossover valve;
the second four-way crossover valve is connected to a fourth four-way crossover valve, and a sixth four-way crossover valve;
the third four-way crossover valve is connected to the fifth four-way crossover valve, the outlet of the pre-cooling unit and the outlet of the first recirculator;
the fifth four-way crossover valve is connected to the inlet of the pre-cooling unit and the inlet of the second recirculator;
the fourth four-way crossover valve is connected to the sixth four-way crossover valve, the inlet of the pre-heating unit and the inlet of the second recirculator;
the sixth four-way crossover valve is connected to the outlet of the pre-heating unit and the outlet of the second recirculator;
the controller is operable to selectively operate the first, second, third, fourth, fifth and sixth four-way crossover valves to direct liquid at temperature $T_1$, $T_2$, $T_{pc}$ or $T_{ph}$ through the supply line and the return line.

8. The system of claim 4, wherein:
the first valve is a first three-way switching valve;
the second valve is a second three-way switching valve;
the first three-way switching valve is connected to the outlet of the pre-cooling unit, a third three-way switching valve, the outlet of the pre-heating unit and a fourth three-way switching valve;
the second three-way switching valve is connected to the inlet of the first recirculator and the inlet of the second recirculator;
the third three-way switching valve is connected to the inlet and outlet of the pre-cooling unit and the outlet of the first recirculator;
the fourth three-way switching valve is connected to the inlet and outlet of the pre-heating unit and the outlet of the second recirculator;
the controller is operable to selectively operate the first, second, third, and fourth three-way switching valves to direct liquid at temperature $T_1$, $T_2$, $T_{pc}$ or $T_{ph}$ through the supply line and the return line.

9. The system of claim 4, wherein:
the first valve is a first three-way switching valve;
the second valve is a second three-way switching valve;
the first three-way switching valve is connected to a third three-way switching valve and a fourth three-way switching valve;

the second three-way switching valve is connected to the inlet of the first recirculator and the inlet of the second recirculator;

the third three-way switching valve is connected to the outlet of the pre-cooling unit and the outlet of the first recirculator;

the fourth three-way switching valve is connected to the outlet of the pre-heating unit and the outlet of the second recirculator;

a first two-way valve is connected to the inlet of the pre-cooling unit and the outlet of the first recirculator;

a second two-way valve is connected to the inlet of the pre-heating unit and the outlet of the second recirculator;

a first valved branch line is connected to the outlet and the inlet of the first recirculator;

a second valved branch line is connected to the outlet and the inlet of the second recirculator;

the controller is operable to selectively operate the first, second, third, and fourth three-way switching valves, the first and second two-way valves and the valves of the first and second valved branch lines to direct liquid at temperature $T_1$, $T_2$, $T_{pc}$ or $T_{ph}$ through the supply line and the return line.

10. The system of claim 4, wherein:
the first valve is a first three-way switching valve;
the second valve is a second three-way switching valve;
the first three-way switching valve is connected to a third three-way switching valve, and a fourth three-way switching valve;
the second three-way switching valve is connected to the inlet of the first recirculator and the inlet of the second recirculator;
the third three-way switching valve is connected to the outlet of the pre-cooling unit and a fifth three-way switching valve;
the fifth three-way switching valve is connected to the inlet of the pre-cooling unit and the outlet of the first recirculator;
the fourth three-way switching valve is connected to the outlet of the pre-heating unit and a sixth three-way switching valve;
the sixth three-way switching valve is connected to the inlet of the pre-heating unit and the outlet of the second recirculator;
an optional first valved branch line is connected to the outlet and the inlet of the pre-cooling unit;
an optional valved branch line is connected to the outlet and the inlet of the pre-heating unit;
a third valved branch line is connected to the outlet and the inlet of the first recirculator;
a fourth valved branch line is connected to the outlet and the inlet of the second recirculator;
the controller is operable to selectively operate the first, second, third, fourth, fifth and sixth three-way switching valves, and the valves of the valved branch lines to direct liquid at temperature $T_1$, $T_2$, $T_{pc}$ or $T_{ph}$ through the supply line and the return line.

11. The system of claim 4, wherein:
the first valve is a first four-way crossover valve;
the second valve is a second four-way crossover valve;
the first four-way crossover valve is connected to the second four-way crossover valve, a third four-way crossover valve, and the inlet of the first recirculator;
the second four-way crossover valve is connected to a fourth four-way crossover valve, and the inlet of the second recirculator;

the third four-way crossover valve is connected to the inlet and the outlet of the pre-cooling unit and the outlet of the first recirculator;

the fourth four-way crossover valve is connected to the inlet and outlet of the pre-heating unit and the outlet of the second recirculator;

the controller is operable to selectively operate the first, second, third, and fourth four-way crossover valves to direct liquid at temperature $T_1$, $T_2$, $T_{pc}$ or $T_{ph}$ through the supply line and the return line.

12. The system of claim 3, wherein:
the supply line is connected to a first valve;
the return line is connected to a second valve;
the first valve is in fluid communication with an outlet of the first recirculator and an outlet of the second recirculator; the first valve is not in fluid communication with the pre-heating unit or the pre-cooling unit;
the second valve is in fluid communication with an inlet of the first recirculator and an inlet of the second recirculator; the second valve is not in fluid communication with the pre-heating unit or the pre-cooling unit;
the pre-cooling unit provides liquid at temperature $T_{pc}$ by passing a liquid at temperature $T_{pc}$ through a first thermal mass which cools the liquid at temperature $T_1$ provided by the first recirculator to $T_{pc}$ when the liquid at temperature $T_1$ flows through the first thermal mass; the liquid at temperature $T_{pc}$ from the pre-cooling unit and the liquid at temperature $T_1$ from the first recirculator do not intermix;
the pre-heating unit provides liquid at temperature $T_{ph}$ by passing a liquid at temperature $T_{ph}$ through a second thermal mass which heats the liquid at temperature $T_2$ provided by the second recirculator to $T_{ph}$ when the liquid at temperature $T_2$ flows through the second thermal mass; the liquid at temperature $T_{ph}$ from the pre-heating unit and the liquid at temperature $T_2$ from the second recirculator do not intermix;
the controller is operable to selectively operate the first and second valves to direct liquid at temperature $T_1$ $T_2$, $T_{pc}$ or $T_{ph}$ through the supply line and the return line.

13. The system of claim 1, wherein the substrate support does not include a heater,
a controller is operable to actuate valves of the recirculation system such that during a multistep process in the chamber the substrate support is maintained at temperature $T_1$ for a time period $\Delta t_c$ during one step and at temperature $T_2$ for a time period $\Delta t_h$ during another step of the multistep process,
the controller being further operable to actuate valves of the recirculation system such that liquid at $T_{ph}$ is supplied to the flow passage immediately prior to supplying liquid at $T_2$ and liquid at $T_{pc}$ is supplied to the flow passage immediately prior to supplying liquid at $T_1$ to the flow passage.

14. A method of operating a recirculation system to control temperature of a substrate support on which a semiconductor substrate is subjected to a multistep process in a semiconductor processing chamber, the method comprising;
supporting a semiconductor substrate on the substrate support wherein temperature of a thermal zone on the substrate support is controlled by circulating liquid in a flow passage in the substrate support, the substrate support including an inlet and an outlet in fluid communication with the flow passage, a supply line in fluid communication with the inlet, and a return line in fluid communication with the outlet;

supplying liquid at temperature $T_1$ to the flow passage, the liquid at temperature $T_1$ being supplied by a first recirculator in fluid communication with the supply line and the return line;

supplying liquid at temperature $T_2$ to the flow passage, the liquid at temperature $T_2$ being supplied by a second recirculator in fluid communication with the supply line and the return line, temperature $T_2$ being at least 10° C. above temperature $T_1$;

supplying liquid at temperature $T_{pc}$ to the flow passage, temperature $T_{pc}$ being at least 10° C. below $T_1$;

supplying liquid at temperature $T_{ph}$ to the flow passage, temperature $T_{ph}$ being at least 10° C. above $T_2$;

the liquid at temperature $T_{pc}$ being supplied immediately prior to supplying the liquid at temperature $T_1$;

the liquid at temperature $T_{ph}$ being supplied immediately prior to supplying the liquid at temperature $T_2$.

15. The method of claim 14, wherein liquid at $T_{pc}$ or liquid at temperature $T_{ph}$ is circulated such that temperature of the thermal zone of the substrate support changes at an initial rate of at least 1° C./s while liquid at temperature $T_{pc}$ or liquid at temperature $T_{ph}$ is supplied to the flow passage.

16. The method of claim 14, wherein liquid at $T_{pc}$ or liquid at temperature $T_{ph}$ is circulated such that temperature of the thermal zone does not overshoot temperature $T_1$ or temperature $T_2$.

17. The method of claim 14, wherein a controller operates valves in the recirculation system to supply liquid at $T_{pc}$ for a time period $\Delta t_{pc}$, immediately prior to supplying liquid at $T_1$, so as to rapidly effect temperature change and maintain the thermal zone at temperature $T_1$ for the time period $\Delta t_c$ during a portion of the multistep process; and/or the controller operates valves in the recirculation system to supply liquid at $T_{ph}$ for a time period $\Delta t_{ph}$, immediately prior to supplying liquid at $T_2$, so as to rapidly effect temperature change and maintain the thermal zone at temperature $T_2$ for the time period $\Delta t_h$ during a portion of the multistep process; wherein $\Delta t_{pc}$ is a fraction of $\Delta t_c$ and $\Delta t_{ph}$ is a fraction of $\Delta t_h$.

18. The method of claim 16, wherein the controller operates the valves to switch from supplying liquid at $T_{pc}$ to supplying liquid at $T_1$, when the temperature of the thermal zone is within 2° C. to $T_1$; and/or the controller operates the valves to switch from supplying liquid at $T_{ph}$ to supplying liquid at $T_2$, when the temperature of the thermal zone is within 2° C. to $T_2$.

19. The method of claim 17, wherein:
the supply line is connected to a first valve;
the return line is connected to a second valve;
the first valve is in fluid communication with an outlet of the first recirculator, an outlet of a pre-cooling unit providing liquid at temperature $T_{pc}$, an outlet of the second recirculator, and an outlet of a pre-heating unit providing liquid at temperature $T_{ph}$;
the second valve is in fluid communication with an inlet of the first recirculator, an inlet of the pre-cooling unit, an inlet of the second recirculator, and an inlet of the pre-heating unit;
the method including selectively operating the first and second valves to direct liquid at temperature $T_1$, $T_2$, $T_{pc}$ or $T_{ph}$ to the flow passage.

20. The method of claim 14, wherein:
the supply line is connected to a first valve;
the return line is connected to a second valve;
the first valve is in fluid communication with an outlet of the first recirculator and an outlet of the second recirculator; the first valve is not in fluid communication with a pre-cooling unit;
the second valve is in fluid communication with an inlet of the first recirculator and an inlet of the second recirculator; the second valve is not in fluid communication with a pre-heating unit;
the pre-cooling unit provides liquid at temperature $T_{pc}$ by passing a liquid at temperature $T_{pc}$ through a first thermal mass which cools the liquid at temperature $T_1$ provided by the first recirculator to $T_{pc}$ when the liquid at temperature $T_1$ flows through the first thermal mass; the liquid at temperature $T_{pc}$ from the pre-cooling unit and the liquid at temperature $T_1$ from the first recirculator do not intermix;
the pre-heating unit provides liquid at temperature $T_{ph}$ by passing a liquid at temperature $T_{ph}$ through a second thermal mass which heats the liquid at temperature $T_2$ provided by the second recirculator to $T_{ph}$ when the liquid at temperature $T_2$ flows through the second thermal mass; the liquid at temperature $T_{ph}$ from the pre-heating unit and the liquid at temperature $T_2$ from the second recirculator do not intermix;
the method including selectively operate the first and second valves to direct liquid at temperature $T_1$, $T_2$, $T_{pc}$ or $T_{ph}$ to the flow passage.

21. The method of claim 14, wherein:
the supply line is connected to a first valve;
the return line is connected to a second valve;
the first valve is in fluid communication with an outlet of the first recirculator and an outlet of the second recirculator; the first valve is not in fluid communication with a pre-cooling unit;
the second valve is in fluid communication with an inlet of the first recirculator and an inlet of the second recirculator; the second valve is not in fluid communication with a pre-heating unit;
the pre-cooling unit provides liquid at temperature $T_{pc}$ by passing a liquid at temperature $T_{pc}$ through a first thermal mass which cools the liquid at temperature $T_1$ provided by the first recirculator to $T_{pc}$ when the liquid at temperature $T_1$ flows through the first thermal mass; the liquid at temperature $T_{pc}$ from the pre-cooling unit and the liquid at temperature $T_1$ from the first recirculator do not intermix;
the pre-heating unit provides liquid at temperature $T_{ph}$ by passing a liquid at temperature $T_{ph}$ through a second thermal mass which heats the liquid at temperature $T_2$ provided by the second recirculator to $T_{ph}$ when the liquid at temperature $T_2$ flows through the second thermal mass; the liquid at temperature $T_{ph}$ from the pre-heating unit and the liquid at temperature $T_2$ from the second recirculator do not intermix;
the method including selectively operating the first and second valves to direct liquid at temperature $T_1$, $T_2$, $T_{pc}$ or $T_{ph}$ to the flow passage.

22. The method of claim 14, further comprising applying an RF bias to the semiconductor substrate by supplying radio frequency power to the substrate support, energizing process gas into a plasma state and plasma etching openings into a layer of material on the semiconductor substrate, the openings being etched for a first time period $\Delta t_c$ while supplying liquid at $T_1$ to the flow passage and for a second time period $\Delta t_h$ while supplying liquid at $T_2$ to the flow passage.

23. The method of claim 14, wherein the substrate support does not include an electrical heater; $\Delta t_h$ is from 50 to 200 seconds; $\Delta t_c$ is from 50 to 200 seconds; $T_1$ is from −10° C. to 50° C.; and $T_2$ is from 30° C. to 110° C.

24. The method of claim 21, wherein the substrate support does not include an electrical heater and the substrate support applies an RF bias to the semiconductor substrate; $\Delta t_h$ is 50 to 200 seconds, $\Delta t_c$ is from 50 to 200 seconds; $T_1$ is from $-10°$ C. to $50°$ C.; and $T_2$ is from $30°$ C. to $110°$ C.

* * * * *